United States Patent
Ota et al.

(10) Patent No.: US 9,412,503 B2
(45) Date of Patent: Aug. 9, 2016

(54) ELECTRONIC COMPONENT INCLUDING OUTER ELECTRODES PROVIDED ON END PORTIONS OF A SURFACE OF AN ELECTRONIC COMPONENT BODY

(71) Applicant: Murata Manufacturing Co., Ltd., Nagaokakyo-shi, Kyoto-fu (JP)

(72) Inventors: Yutaka Ota, Nagaokakyo (JP); Masato Kimura, Nagaokakyo (JP); Kota Zenzai, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 66 days.

(21) Appl. No.: 14/174,034

(22) Filed: Feb. 6, 2014

(65) Prior Publication Data
US 2014/0239772 A1    Aug. 28, 2014

(30) Foreign Application Priority Data

Feb. 28, 2013   (JP) .................................. 2013-038150

(51) Int. Cl.
| | |
|---|---|
| *H01G 4/30* | (2006.01) |
| *H01G 4/012* | (2006.01) |
| *H01G 4/12* | (2006.01) |
| *H01C 1/028* | (2006.01) |
| *H01C 7/18* | (2006.01) |
| *H01L 41/047* | (2006.01) |
| *H01F 17/00* | (2006.01) |

(52) U.S. Cl.
CPC ................. *H01C 1/028* (2013.01); *H01C 7/18* (2013.01); *H01G 4/012* (2013.01); *H01G 4/12* (2013.01); *H01G 4/30* (2013.01); *H01L 41/0472* (2013.01); *H01F 17/0013* (2013.01)

(58) Field of Classification Search
CPC ............ H01G 4/12; H01G 4/012; H01G 4/30
See application file for complete search history.

(56) References Cited

U.S. PATENT DOCUMENTS

| 6,576,497 B2* | 6/2003 | Ahiko et al. ................... 438/122 |
|---|---|---|
| 2003/0026059 A1* | 2/2003 | Togashi ........................ 361/303 |
| 2003/0099083 A1 | 5/2003 | Ohtsuka et al. |
| 2008/0080120 A1* | 4/2008 | Togashi ..................... 361/301.4 |

(Continued)

FOREIGN PATENT DOCUMENTS

| JP | 10-289837 A | 10/1998 |
|---|---|---|
| JP | 2003-168623 A | 6/2003 |

(Continued)

OTHER PUBLICATIONS

Official Communication issued in corresponding Japanese Patent Application No. 2013-038150, mailed on Feb. 10, 2015.

*Primary Examiner* — David M Sinclair
(74) *Attorney, Agent, or Firm* — Keating & Bennett, LLP

(57) ABSTRACT

In an electronic component, when $L0$ is a dimension of an electronic component body in a first direction, $L1$ is a distance between a first outer electrode and a second outer electrode on a first surface in the first direction, and $L2$ is a dimension of each of the first and second outer electrodes on the first surface in the first direction, $0\% < L1/L0 < 10\%$ and $30\% < L2/L0 < 50\%$ are satisfied.

17 Claims, 9 Drawing Sheets

(56) References Cited

U.S. PATENT DOCUMENTS

| | | | |
|---|---|---|---|
| 2009/0002921 A1* | 1/2009 | Ritter et al. | 361/321.3 |
| 2009/0154055 A1* | 6/2009 | Takashima et al. | 361/301.4 |
| 2009/0284897 A1* | 11/2009 | Itamura | 361/303 |
| 2011/0235232 A1 | 9/2011 | Takeuchi et al. | |
| 2011/0235234 A1 | 9/2011 | Yamamoto et al. | |
| 2013/0120900 A1* | 5/2013 | Chung et al. | 361/303 |
| 2013/0294009 A1* | 11/2013 | Takeuchi et al. | 361/305 |
| 2014/0043719 A1* | 2/2014 | Togashi | 361/301.1 |

FOREIGN PATENT DOCUMENTS

| | | | |
|---|---|---|---|
| JP | 2003-178933 A | | 6/2003 |
| JP | 2006339337 A | * | 12/2006 |
| JP | 2011-210836 A | | 10/2011 |
| JP | 2011-228644 A | | 11/2011 |

* cited by examiner

ELECTRONIC COMPONENT INCLUDING OUTER ELECTRODES PROVIDED ON END PORTIONS OF A SURFACE OF AN ELECTRONIC COMPONENT BODY

BACKGROUND OF THE INVENTION

1. Field of the Invention

The present invention relates to an electronic component.

2. Description of the Related Art

With the recent reductions in the size of mobile electronic devices and the like, there are increasing demands for reduction in size of electronic components and mounting intervals between the electronic components. Japanese Unexamined Patent Application Publication No. 10-289837, for example, proposes an electronic component that can be reduced in side and with which mounting intervals can be reduced. In the electronic component described in Japanese Unexamined Patent Application Publication No. 10-289837, first and second inner electrodes are alternately arranged in a ceramic element with intervals therebetween. The first and second inner electrodes extend to one surface of the ceramic element. More specifically, the first inner electrodes extend to one end portion of one surface of the ceramic element, and the second inner electrodes extend to the other end portion of that surface of the ceramic element. A first outer electrode, which is connected to the first inner electrodes, and a second outer electrode, which is connected to the second inner electrodes, are formed on that surface of the ceramic element.

Electronic components in which first and second outer electrodes are provided on one surface thereof, such as the electronic component described in Japanese Unexamined Patent Application Publication No. 10-289837, are difficult to mount in a stable state, and the bonding strength between such an electronic component and a mounting board tends to be low.

SUMMARY OF THE INVENTION

Preferred embodiments of the present invention provide an electronic component that can be mounted on a mounting board with a high bonding strength.

According to a preferred embodiment of the present invention, an electronic component includes an electronic component body, a first inner electrode, a second inner electrode, a first outer electrode, and a second outer electrode. The electronic component body includes first and second surfaces, third and fourth surfaces, and fifth and sixth surfaces. The first and second surfaces extend in a first direction and a second direction perpendicular or substantially perpendicular to the first direction. The third and fourth surfaces extend in the first direction and a third direction perpendicular or substantially perpendicular to the first and second directions. The fifth and sixth surfaces extend in the second and third directions. The first inner electrode is provided in the electronic component body. The first inner electrode extends to a first end portion of the first surface in the first direction. The second inner electrode is provided in the electronic component body so as to oppose the first inner electrode in the second direction. The second inner electrode extends to a second end portion of the first surface in the first direction. The first outer electrode is provided on the first end portion of the first surface in the first direction. The first outer electrode is connected to the first inner electrode. The second outer electrode is provided on the second end portion of the first surface in the first direction. The second outer electrode is connected to the second inner electrode. When $L0$ is a dimension of the electronic component body in the first direction, $L1$ is a distance between the first outer electrode and the second outer electrode on the first surface in the first direction, and $L2$ is a dimension of each of the first and second outer electrodes on the first surface in the first direction, $0\% < L1/L0 < 10\%$ and $30\% < L2/L0 < 50\%$ are satisfied.

According to a preferred embodiment of the present invention, when $L3$ is a dimension of the electronic component body in the second direction, $L0 > L3$, $L1/L0 \leq 5\%$, and $35\% \leq L2/L0 \leq 50\%$ are satisfied.

According to another preferred embodiment of the present invention, when $L3$ is a dimension of the electronic component body in the second direction, $L0 < L3$, $L1/L0 \leq 10\%$, and $30\% \leq L2/L0 \leq 40\%$ are satisfied.

According to various preferred embodiments of the present invention, an electronic component that can be mounted on a mounting board with a high bonding strength is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
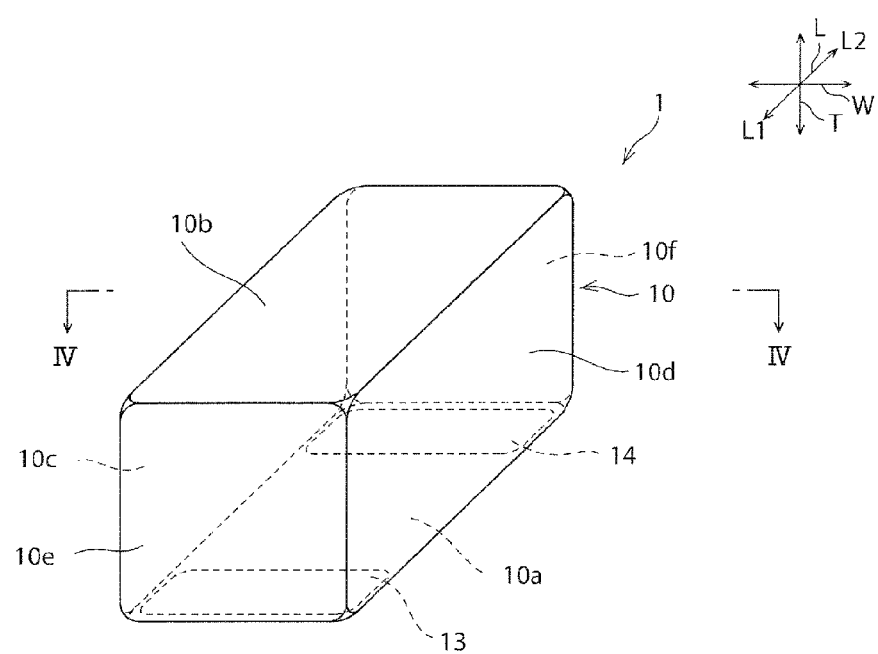
FIG. 1 is a schematic perspective view of an electronic component according to a first preferred embodiment of the present invention.

Preferred embodiments of the present invention will now be described. The preferred embodiments described below are merely examples. The present invention is not limited in any way to the preferred embodiments described below.

In each of the figures referred to in the preferred embodiments, components having the same or substantially the same functions are denoted by the same reference numerals. The figures referred to in the preferred embodiments are drawn schematically. Ratios between the dimensions of objects drawn in the figures may differ from the actual ratios between the dimensions of the objects. The dimensional ratios and the like of the elements may also differ between the figures.

Specific dimensional ratios and the like of the objects are to be determined in consideration of the following description.

First Preferred Embodiment

Figure 2:
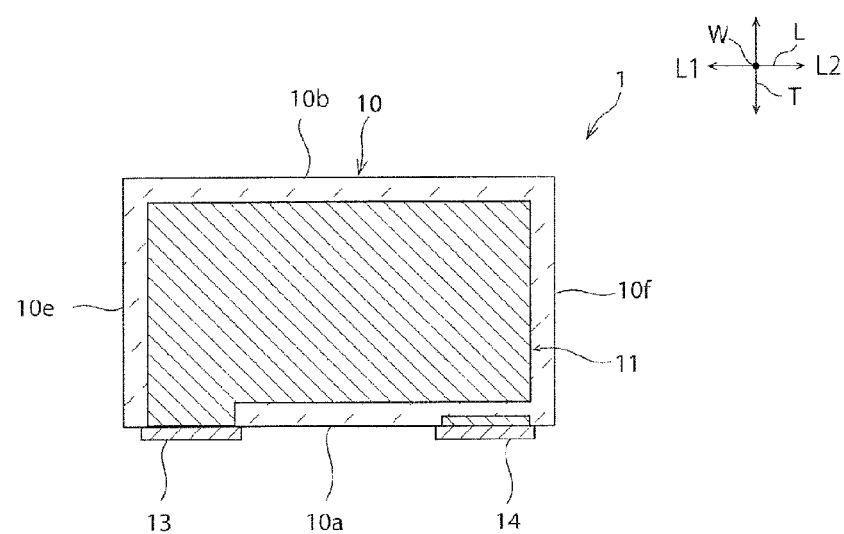
FIG. 2 is a schematic sectional view of the electronic component according to the first preferred embodiment of the present invention.
Figure 3:
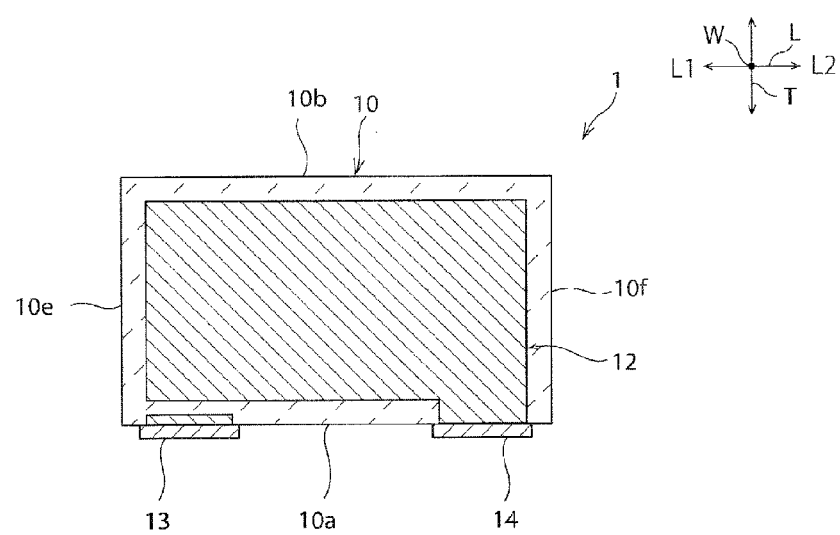
FIG. 3 is a schematic sectional view of the electronic component according to the first preferred embodiment of the present invention.
Figure 4:
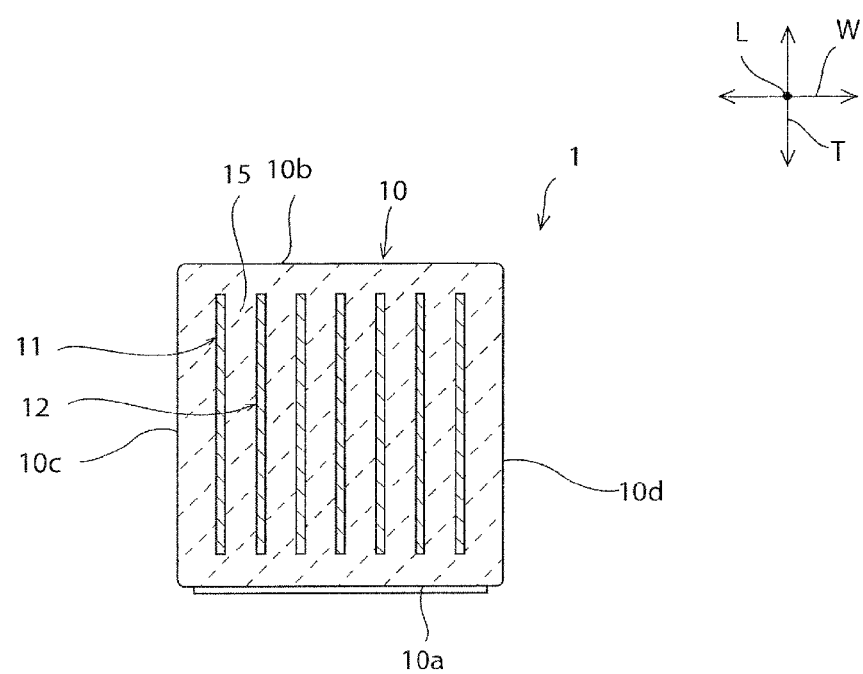
FIG. 4 is a schematic sectional view of FIG. 1 taken along line IV-IV of the present invention.
Figure 5:
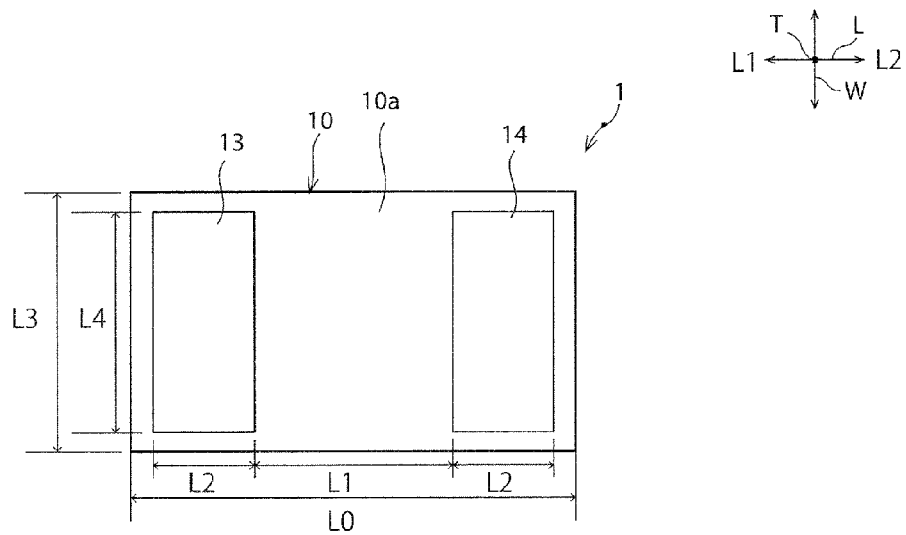
FIG. 5 is a schematic rear view of the electronic component according to the first preferred embodiment of the present invention.

FIG. 1 is a schematic perspective view of an electronic component according to the present preferred embodiment. FIGS. 2 and 3 are schematic sectional views of the electronic component of the present preferred embodiment. FIG. 4 is a schematic sectional view of FIG. 1 taken along line IV-IV. FIG. 5 is a schematic rear view of the electronic component according to the present preferred embodiment.

Referring to FIGS. 1 to 5, an electronic component 1 includes an electronic component body 10. The electronic component body 10 preferably has a rectangular or substantially rectangular parallelepiped shape. The electronic component body 10 includes first and second principal surfaces 10a and 10b that oppose each other, first and second side surfaces 10c and 10d that oppose each other, and first and second end surfaces 10e and 10f that oppose each other. Each of the first and second principal surfaces 10a and 10b extends in a length direction L and a width direction W. Each of the first and second side surfaces 10c and 10d extends in the length direction L and a thickness direction T. Each of the first and second end surfaces 10e and 10f extends in the width direction W and the thickness direction T.

In the present preferred embodiment, the following definitions are applied:

Length direction L: first direction
Width direction W: second direction
Thickness direction T: third direction
First principal surface 10a: first surface
Second principal surface 10b: second surface
First side surface 10c: third surface
Second side surface 10d: fourth surface
First end surface 10e: fifth surface
Second end surface 10f: sixth surface The length direction L and the width direction W are perpendicular to each other. The thickness direction T is perpendicular to each of the length direction L and the width direction W.

In the present preferred embodiment, the term "rectangular parallelepiped" includes rectangular parallelepipeds having chamfered or rounded corner portions or ridge portions. In other words, the electronic component body 10 may have a rectangular or substantially rectangular parallelepiped shape in which at least one of the corner portions and ridge portions thereof is chamfered or rounded.

The electronic component body 10 is made of an appropriate ceramic material. The ceramic material that forms the electronic component body 10 is selected as appropriate in accordance with the characteristics or the like of the electronic component 1.

When, for example, the electronic component 1 is a ceramic capacitor element, the electronic component body 10 may be made of a material containing a dielectric ceramic as a main component. Examples of the dielectric ceramic include $BaTiO_3$, $CaTiO_3$, $SrTiO_3$, and $CaZrO_3$. A sub-component such as a Mn compound, a Fe compound, a Cr compound, a Co compound, or a Ni compound may be added as appropriate to the material of the electronic component body 10.

When, for example, the electronic component 1 is a ceramic piezoelectric element, the electronic component body 10 may be made of a material containing a piezoelectric ceramic as a main component. An example of the piezoelectric ceramic is a PZT ceramic.

When, for example, the electronic component 1 is a thermistor element, the electronic component body 10 may be made of, for example, a semiconductor ceramic. An example of the semiconductor ceramic is a spinel-based ceramic.

When, for example, the electronic component 1 is an inductor element, the electronic component body 10 may be made of a magnetic ceramic. An example of the magnetic ceramic is a ferrite ceramic.

In the present preferred embodiment, an example in which the electronic component 1 is a ceramic capacitor and the electronic component body 10 is made of a material containing a dielectric ceramic as a main component will be described.

As illustrated in FIG. 4, a plurality of first inner electrodes 11 and a plurality of second inner electrodes 12 are provided in the electronic component body 10. Each of the first and second inner electrodes 11 and 12 is disposed in the electronic component body 10 so as to extend in the length direction L and the thickness direction T. The first and second inner electrodes 11 and 12 are alternately arranged in the width direction W. Portions of the first and second inner electrodes 11 and 12 oppose each other in the width direction W with ceramic layers 15 interposed therebetween. The thickness of the ceramic layers 15 is preferably about 0.3 μm to about 10 μm, for example. The thickness of each of the first and second inner electrodes 11 and 12 is preferably about 0.2 μm to about 2.0 μm, for example.

The first and second inner electrodes 11 and 12 are not particularly limited as long as they are conductive. The first and second inner electrodes 11 and 12 may be made of a metal, such as Ni, Cu, Ag, Pd, or Au, or an alloy containing at least one of these metals, such as an Ag—Pd alloy.

As illustrated in FIG. 2, each first inner electrode 11 extends to an L1-side portion of the first principal surface 10a in the length direction L. As illustrated in FIG. 3, each second inner electrode 12 extends to an L2-side portion of the first principal surface 10a in the length direction L.

As illustrated in FIGS. 2, 3, and 5, a first outer electrode 13 is provided on the L1-side portion of the first principal surface 10a in the length direction L. The first outer electrode 13 is arranged so as to cover the exposed portions of the first inner electrodes 11, and is connected to the first inner electrodes 11. The first outer electrode 13 extends from one end portion to the other end portion of the L1-side portion of the first principal surface 10a in the width direction W.

A second outer electrode 14 is provided on the L2-side portion of the first principal surface 10a in the length direction L. The second outer electrode 14 is arranged so as to cover the exposed portions of the second inner electrodes 12, and is connected to the second inner electrodes 12. The second outer electrode 14 extends from one end portion to the other end portion of the L2-side portion of the first principal surface 10a in the width direction W.

The first and second outer electrodes 13 and 14 may include underlying electrode layers arranged so as to cover the exposed portions of the first and second inner electrodes 11 and plating layers arranged so as to cover the underlying electrode layers. In such a case, the underlying electrode layers are arranged on the first principal surface 10a of the electronic component body 10 so as to cover the exposed portions of the first and second inner electrodes 11 and 12. The first and second outer electrodes 13 and 14 do not protrude from the first principal surface 10a, and are preferably not provided on the first and second side surfaces 10c and 10d, the first and second end surfaces 10e and 10f, and the second principal surface 10b. The underlying electrode layers also seal the exposed portions of the first and second inner electrodes 11 and 12.

The underlying electrode layers may be formed by printing conductive paste layers or by plating. In the case where the underlying electrode layers are formed by printing conductive paste layers, the conductive paste layers are preferably made of paste containing a conductive metal and a glass component. In the case where the underlying electrode layers contain a glass component, the glass component contained in the underlying electrode layers is positioned at the boundaries between the electronic component body 10 and the underlying electrode layers. Accordingly, the sealing performance between the electronic component body 10 and the underlying electrode layers is improved and the bonding force applied between the ceramic element and the underlying electrode layers is increased. Preferred examples of the glass component include glass containing, for example, B, Si, Ba, Mg, Al, Li, or Zn. Preferred examples of the conductive metal include Cu, Ni Ag, Pd, an Ag—Pd alloy, and Au. The underlying electrode layers may be formed either by co-firing by firing the underlying electrode layers together with the inner electrodes 11 and 12 or by post-firing by applying and firing the conductive paste. In the case where the underlying electrode layers are formed by printing the conductive paste layers, the thickness of the underlying electrode layers is preferably about 10 μm to about 50 μm, for example.

The underlying electrode layers may instead be formed by curing a conductive resin containing a thermosetting resin.

Alternatively, the underlying electrode layers may be defined by plating layers. In such a case, the plating layers may be made of, for example, at least one material selected from a group including Cu, Ni, Sn, Pb, Au, Ag, Pd, Bi, and Zn. Preferably, the plating layers that constitute the underlying electrode layers (hereinafter referred to as "underlying plating layers") do not contain a glass component. The content of metal per unit volume of the underlying plating layers is preferably 99 vol % or more, for example. When, for example, the inner electrodes 11 and 12 are made of Ni, the underlying plating layers are preferably made of Cu, which has a high bondability to Ni. The thickness of the underlying plating layers preferably is, for example, preferably about 1 μm to about 15 μm.

The plating layers formed on the underlying electrode layers may be made of, for example, at least one material selected from a group including Cu, Ni, Sn, Pb, Au, Ag, Pd, Bi and Zn. Each plating layer may be composed of a multilayer body including a plurality of plating layers. For example, a multilayer body including a Ni plating layer and a Sn plating layer may be formed on each of the underlying electrode layers. The Ni plating layer provides a solder barrier, and the Sn plating layer improves wettability. The thickness of each plating layer is preferably about 1 μm to about 10 μm, for example. A conductive resin layer for reducing stress may be provided between each underlying electrode layer and the corresponding plating layer.

Referring to FIG. 5, the following definitions are applied:

Dimension of the electronic component body 10 in the length direction L: L0

Distance between the first outer electrode 13 and the second outer electrode 14 on the first principal surface 10a in the length direction L: L1

Dimension of each of the outer electrodes 13 and 14 on the first principal surface 10a in the length direction L: L2

Dimension of the electronic component body 10 in the width direction W: L3

Dimension of each of the outer electrodes 13 and 14 in the width direction W: L4

In the electronic component 1, 0%<L1/L0<10% and 30%<L2/L0<50% are satisfied. Accordingly, as confirmed by the examples of experiments described in detail below, the electronic component 1 can be mounted on a mounting board with a high bonding strength. This is probably because when 0%<L1/L0<10% and 30%<L2/L0<50% are satisfied and the outer electrodes 13 and 14 have a large width, the electronic component 1 does not easily tilt when being mounted on the mounting board. Accordingly, a moment generated when a stress is applied to the electronic component 1 mounted on the mounting board is significantly reduced or prevented.

When 10%<L1/L0 and L2/L0<30%, the distance between the outer electrodes 13 and 14 is excessively large, and there is a risk that the bonding force applied between the electronic component 1 and the mounting board when the electronic component 1 is mounted on the mounting board will be reduced. When 10%<L1/L0 and 50%<L2/L0, there is a risk that the insulation resistance will be reduced due to surface leakage on the electronic component or short-circuiting between the outer electrodes.

From the viewpoint of increasing the bonding strength with which the electronic component 1 is mounted on the mounting board, in the case where L0>L3 is satisfied as in the present preferred embodiment, L1/L0≤5% and 35%≤L2/L0≤50% are preferably satisfied.

When 5%<L1/L0 and L2/L0<35%, the distance between the outer electrodes 13 and 14 is excessively large, and there is a risk that the bonding force applied between the electronic component 1 and the mounting board when the electronic component 1 is mounted on the mounting board will be reduced. When 5%<L1/L0 and 50%<L2/L0, there is a risk that the insulation resistance will be reduced due to surface leakage on the electronic component or short-circuiting between the outer electrodes.

More preferably, in the case where L0>L3 is satisfied as in the present preferred embodiment, 1.3%<L1/L0<5% is satisfied. When L1/L0<1.3%, there is a risk that short-circuiting between the outer electrodes will occur due to a difference in thickness between the plating layers or abnormal growth of the plating layers.

The dimension L4 preferably satisfies 83%≤L4/L3≤96.5%. When L4/L3 is smaller than 83%, there is a risk that the bonding strength will be reduced due to a reduction in the adhesion area. When L4/L3 is greater than 96.5%, there is a possibility that the dimensions of the first and second outer electrodes will be greater than those of the electronic component body. Therefore, when the electronic component 1 is mounted on the mounting board with solder, there is a risk that the solder will flow to the first and second side surfaces or the first and second end surfaces of the electronic component 1 and it will be difficult to reduce the mounting space.

Another preferred embodiment of the present invention will now be described. In the following description, components having the same or substantially the same functions as those of the components in the above-described first preferred embodiment are denoted by the same reference numerals, and explanations thereof are thus omitted.

Second Preferred Embodiment

Figure 6:
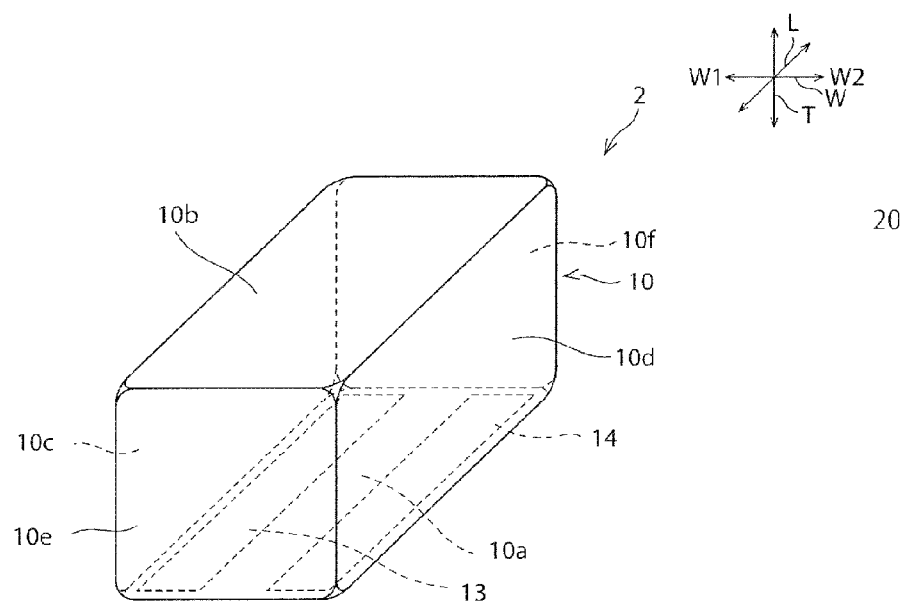
FIG. 6 is a schematic perspective view of an electronic component according to a second preferred embodiment of the present invention.
Figure 7:
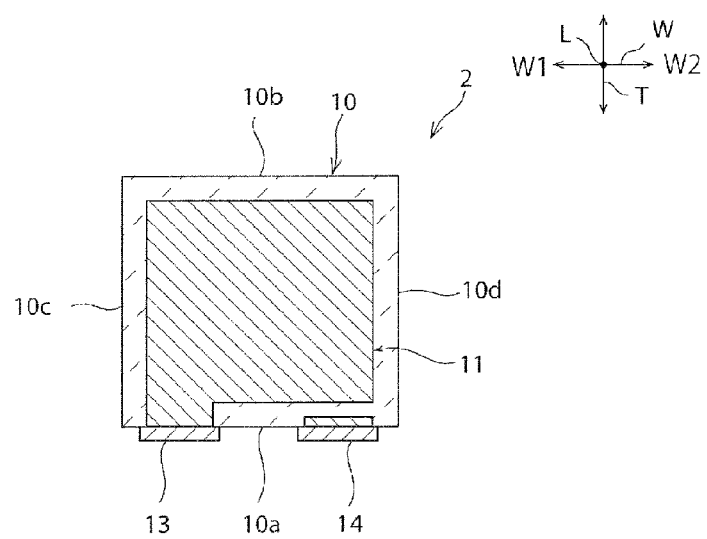
FIG. 7 is a schematic sectional view of the electronic component according to the second preferred embodiment of the present invention.
Figure 8:
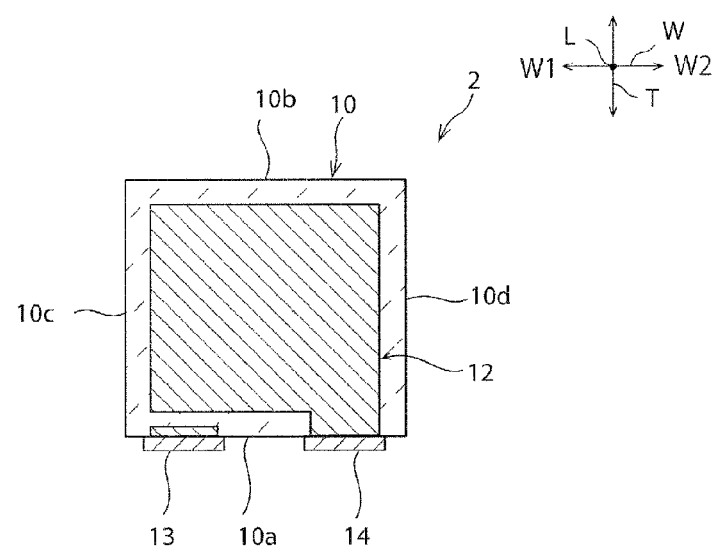
FIG. 8 is a schematic sectional view of the electronic component according to the second preferred embodiment of the present invention.
Figure 9:
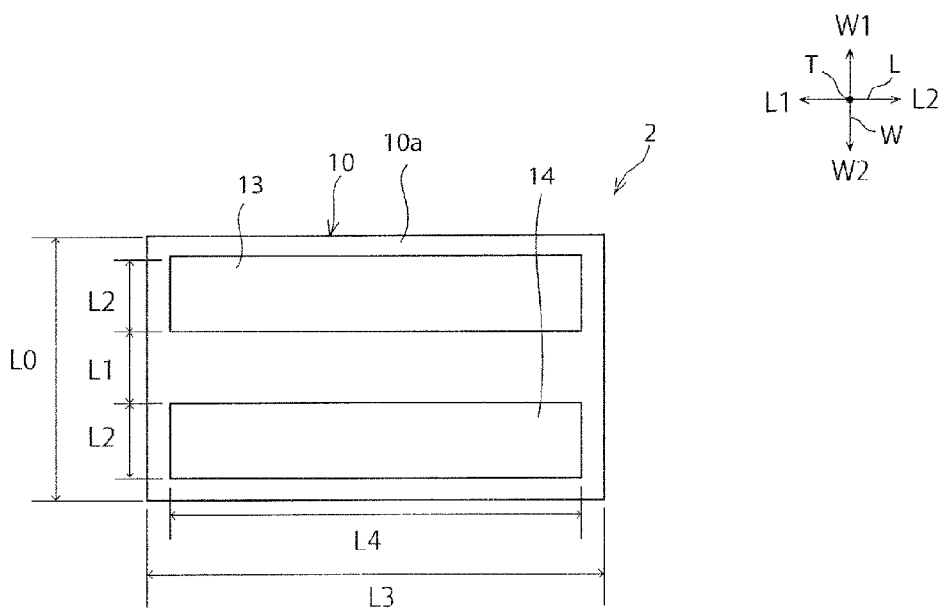
FIG. 9 is a schematic rear view of the electronic component according to the second preferred embodiment of the present invention.

FIG. 6 is a schematic perspective view of an electronic component according to the second preferred embodiment. FIG. 7 is a schematic sectional view of the electronic component according to the second preferred embodiment. FIG. 8 is another schematic sectional view of the electronic component according to the second preferred embodiment. FIG. 9 is a schematic rear view of the electronic component according to the second preferred embodiment.

In an electronic component 2 according to the present preferred embodiment, the direction in which first and second inner electrodes 11 and 12 are stacked and the arrangement of first and second outer electrodes 13 and 14 differ from those in the electronic component 1 according to the first preferred embodiment.

Referring to FIGS. 7 and 8, the first and second inner electrodes 11 and 12 are arranged so as to extend in the width direction W and the thickness direction T. The first inner electrodes 11 and the second inner electrodes 12 oppose one another in the length direction L. The first inner electrodes 11 are exposed at a W1-side portion of a first principal surface 10a in a width direction W, and the second inner electrodes 12 are exposed at a W2-side portion of the first principal surface 10a in the width direction W.

As illustrated in FIGS. 7 and 8, a first outer electrode 13 is provided on the W1-side portion of the first principal surface 10a. The first outer electrode 13 is formed so as to cover the exposed portions of the first inner electrodes 11, and is connected to the first inner electrodes 11. The first outer electrode 13 extends from one end portion to the other end portion of the first principal surface 10a in the length direction L.

A second outer electrode 14 is provided on the W2-side portion of the first principal surface 10a. The second outer electrode 14 is arranged so as to cover the exposed portions of the second inner electrodes 12, and is connected to the second inner electrodes 12. The second outer electrode 14 extends from one end portion to the other end portion of the first principal surface 10a in the length direction L.

In the present preferred embodiment, the following definitions are applied:
  Length direction L: second direction
  Width direction W: first direction
  Thickness direction T: third direction
  First principal surface 10a: first surface
  Second principal surface 10b: second surface
  First side surface 10c: fifth surface
  Second side surface 10d: sixth surface
  First end surface 10e: third surface
  Second end surface 10f: fourth surface Also in the electronic component 2, similar to the electronic component 1, 0%<L1/L0<10% and 30%<L2/L0<50% are satisfied. Accordingly, as confirmed by the examples of experiments described in detail below, the electronic component 2 can be mounted on a mounting board with a high bonding strength.

When 10%<L1/L0 and L2/L0<30%, the distance between the outer electrodes 13 and 14 is excessively large, and there is a risk that the bonding force applied between the electronic component 1 and the mounting board when the electronic component 1 is mounted on the mounting board will be reduced. When 10%<L1/L0 and 50%<L2/L0, there is a risk that the insulation resistance will be reduced due to surface leakage on the electronic component or short-circuiting between the outer electrodes.

From the viewpoint of increasing the bonding strength with which the electronic component 2 is mounted on the mounting board, in the case where L0<L3 is satisfied as in the present preferred embodiment, L1/L0≤10% and 30% L2/L0≤40% are preferably satisfied.

When 10%<L1/L0 and L2/L0<35%, the distance between the outer electrodes 13 and 14 is excessively large, and there is a risk that the bonding force applied between the electronic component 2 and the mounting board when the electronic component 2 is mounted on the mounting board will be reduced. When 10%<L1/L0 and 40%<L2/L0, there is a risk that the insulation resistance will be reduced due to surface leakage on the electronic component or short-circuiting between the outer electrodes.

More preferably, in the case where L0<L3 is satisfied as in the present preferred embodiment, 2.5%<L1/L0<10% is satisfied. When L1/L0<2.5%, there is a risk that short-circuiting between the outer electrodes will occur due to a difference in thickness between the plating layers or abnormal growth of the plating layers.

When L0<L3, the dimension L4 preferably satisfies 83%≤L4/L3≤96.5%. When L4/L3 is smaller than 83%, there is a risk that the bonding strength will be reduced due to a reduction in the adhesion area. When L4/L3 is greater than 96.5%, there is a possibility that the dimensions of the first and second outer electrodes will be greater than those of the electronic component body. Therefore, when the electronic component 2 is mounted on the mounting board with solder, there is a risk that the solder will flow to the first and second side surfaces or the first and second end surfaces of the electronic component 1 and it will be difficult to reduce the mounting space.

EXAMPLE 1

Electronic components (capacitors) that are the same or substantially similar to the electronic component 1 according to the first preferred embodiment were manufactured under the following conditions:
  Length of electronic component (design value): 3.2 mm
  Width of electronic component (design value): 1.6 mm
  Thickness of electronic component (design value): 1.6 mm
  Capacitance (design value): 10 μF
  Rated Voltage (design value): 16 V
  Thickness of ceramic layers (design value): 3.6 μm
  Number of inner electrodes that are stacked: 340
  Material of electronic component body: barium titanate ceramics
  Outer electrodes: Cu plating layer (7 μm (design value)), Ni plating layer (4 μm (design value)), and Sn plating layer (3 μm (design value)) in that order from the electronic component body
  Material of inner electrodes: Ni
  Firing temperature: 1200° C. to 1260° C.
  L1/L0: 1.3%, 3.8%, and 12%
  L2/L0: 18.8%, 25%, 39.1%, and 46.8%
  Target value of L4 was 1.544 mm
  Target value of L0−(L1+L2×2) was 0.58 mm The outer electrodes and the like of twenty samples were observed with a microscope (VHX-100F manufactured by KEYENCE) at a magnification of 100 times, and the maximum dimensions thereof were determined. The averages of the maximum dimensions were calculated as the dimensions of the outer electrodes and the like.

The manufactured electronic components were mounted on a board with solder paste. Then, the board was fixed with a fixing jig, and a central portion of a side surface of each electronic component was pressed by a pressing jig at about 0.1 mm/sec to about 0.5 mm/sec, for example, in the width direction until the electronic component was detached from the board. The stress applied when the electronic component was detached from the board was determined as the bonding strength. Each electronic component was evaluated as "G" when the bonding strength thereof was 30 N or more, and as "NG" when the bonding strength thereof was less than 30 N. The result is shown in Table 1.

EXAMPLE 2

Electronic components (capacitors) that are the same or substantially similar to the electronic component 2 according to the second preferred embodiment were manufactured under the following conditions:

Length of electronic component (design value): 3.2 mm
Width of electronic component (design value): 1.6 mm
Thickness of electronic component (design value): 1.6 mm
Capacitance (design value): 10 µF
Rated Voltage (design value): 16 V
Thickness of ceramic layers (design value): 3.6 µm
Number of inner electrodes that are stacked: 340
Material of electronic component body: barium titanate ceramics
Outer electrodes: Cu plating layer (7 µm (design value)), Ni plating layer (4 µm (design value)), and Sn plating layer (3 µm (design value)) in that order from the electronic component body
Material of inner electrodes: Ni
Firing temperature: 1200° C. to 1260° C.
L1/L0: 2.5%, 7.5%, and 8.8%
L2/L0: 12.5%, 25%, 31.3%, and 39.4%
Target value of L4 was 1.544 mm
Target value of L0−(L1+L2×2) was 0.2 mm The manufactured electronic components were evaluated similarly to the electronic components of Example 1. The result is shown in Table 2.

TABLE 1

|  |  | L2/L0 (%) | | | |
| --- | --- | --- | --- | --- | --- |
|  |  | 18.8 | 25 | 39.1 | 46.8 |
| L1/L0 (%) | 1.3 | NG | NG | G | G |
|  | 3.8 | NG | NG | G | G |
|  | 12 | NG | NG | Cannot be Designed | Cannot be Designed |

TABLE 2

|  |  | L2/L0 (%) | | | |
| --- | --- | --- | --- | --- | --- |
|  |  | 12.5 | 25 | 31.3 | 39.4 |
| L1/L0 (%) | 2.5 | NG | NG | G | G |
|  | 7.5 | NG | NG | G | G |
|  | 8.8 | NG | NG | G | G |

It is clear from the results shown in Tables 1 and 2 that when 0%<L1/L0<10% and 30%<L2/L0<50% are satisfied, the bonding strength can be increased. It is clear from the result shown in Table 1 that when L0>L3, the bonding strength can be further increased by satisfying L1/L0≤5% and 35%≤L2/L0≤50%. It is clear from the result shown in Table 2 that when L0 <L3, the bonding strength can be further increased by satisfying L1/L0≤10% and 30% L2/L0≤40%.

In Table 1, "Cannot be Designed" means that the dimensions are out of standard dimensions of the electronic component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    an electronic component body including first and second surfaces that extend in a first direction and a second direction perpendicular to the first direction, third and fourth surfaces that extend in the first direction and a third direction perpendicular to the first and second directions, and fifth and sixth surfaces that extend in the second and third directions;
    a first inner electrode that is provided in the electronic component body and extends to a first end portion of the first surface in the first direction;
    a second inner electrode that is provided in the electronic component body so as to oppose the first inner electrode in the second direction and extends to a second end portion of the first surface in the first direction;
    a first outer electrode provided on the first end portion of the first surface in the first direction and connected to the first inner electrode; and
    a second outer electrode provided on the second end portion of the first surface in the first direction and connected to the second inner electrode; wherein
    the first and second outer electrodes are disposed only on the first surface and are spaced away from outer edges of the first surface; and
    when L0 is a dimension of the electronic component body in the first direction, L1 is a distance between the first outer electrode and the second outer electrode on the first surface in the first direction, L2 is a dimension of each of the first and second outer electrodes on the first surface in the first direction, and L3 is a dimension of the electronic component body in the second direction, L0>L3, 0%<L1/L0≤5%, and 35%≤L2/L0≤50% are satisfied.

2. The electronic component according to claim 1, wherein the electronic component body has a rectangular or substantially rectangular parallelepiped shape.

3. The electronic component according to claim 1, wherein the electronic component is one of a ceramic capacitor element, a ceramic piezoelectric element, a thermistor element, and an inductor element.

4. The electronic component according to claim 1, wherein the electronic component body is made of one of a material containing dielectric ceramic as a primary component, piezoelectric ceramic as a primary component, a semiconductor ceramic, and a magnetic ceramic.

5. The electronic component according to claim 1, wherein the electronic component body includes ceramic layers each have a thickness of about 0.3 µm to about 10 µm.

6. The electronic component according to claim 1, wherein the first and second inner electrodes each have a thickness of about 0.2 µm to about 2.0 µm.

7. The electronic component according to claim 1, wherein each of the first and second inner layers is formed of at least one of Ni, Cu, Ag, Pd, Au, and an Ag-Pd alloy.

8. The electronic component according to claim 1, wherein each of the first and second outer electrodes includes an underlying electrode layer that covers exposed portions of the first and second inner electrodes.

9. The electronic component according to claim 8, wherein the underlying electrode layers seal the exposed portions of the first and second inner electrodes.

10. The electronic component according to claim 8, wherein the underlying electrode layer is a plated layer or a baked conductive film.

11. The electronic component according to claim 8, wherein the underlying electrode layer includes a glass component disposed at an interface between the electronic component body and the underlying electrode layer.

12. The electronic component according to claim 8, wherein the underlying electrode layer has a thickness of about 10 µm to about 50 µm.

13. The electronic component according to claim 8, wherein the underlying electrode layer has a thickness of about 1 µm to about 15 µm.

14. The electronic component according to claim 8, wherein the underlying electrode layer includes plated layers made of at least one of Cu, Ni, Sn, Pb, Au, Ag, Pd, Bi, and Zn.

15. The electronic component according to claim 14, wherein a thickness of each of the plating layers is about 1 µm to about 10 µm.

16. The electronic component according to claim 1, wherein, when $L4$ is a dimension of each of the first and second outer electrodes in the second direction, $83\% \leq L4/L3 \leq 96.5\%$ is satisfied.

17. An electronic component comprising:
- an electronic component body including first and second surfaces that extend in a first direction and a second direction perpendicular to the first direction, third and fourth surfaces that extend in the first direction and a third direction perpendicular to the first and second directions, and fifth and sixth surfaces that extend in the second and third directions;
- a first inner electrode that is provided in the electronic component body and extends to a first end portion of the first surface in the first direction;
- a second inner electrode that is provided in the electronic component body so as to oppose the first inner electrode in the second direction and extends to a second end portion of the first surface in the first direction;
- a first outer electrode provided on the first end portion of the first surface in the first direction and connected to the first inner electrode; and
- a second outer electrode provided on the second end portion of the first surface in the first direction and connected to the second inner electrode; wherein
- the first and second outer electrodes are disposed only on the first surface and are spaced away from outer edges of the first surface; and
- when $L0$ is a dimension of the electronic component body in the first direction, $L1$ is a distance between the first outer electrode and the second outer electrode on the first surface in the first direction, and $L2$ is a dimension of each of the first and second outer electrodes on the first surface in the first direction, and $L3$ is a dimension of the electronic component body in the second direction, $L0>L3$, $1.3\%<L1/L0\leq5\%$, and $30\%<L2/L0<50\%$ are satisfied.

* * * * *